US007859108B2

(12) United States Patent
Lee et al.

(10) Patent No.: US 7,859,108 B2
(45) Date of Patent: Dec. 28, 2010

(54) FLIP CHIP PACKAGE AND METHOD FOR MANUFACTURING THE SAME

(75) Inventors: Woong Sun Lee, Gyeonggi-do (KR); Il Hwan Cho, Gyeonggi-do (KR); Myung Geun Park, Seoul (KR); Cheol Ho Joh, Seoul (KR); Eun Hye Do, Gyeonggi-do (KR); Ki Young Kim, Gyeonggi-do (KR); Ji Eun Kim, Gyeonggi-do (KR); Jong Hyun Nam, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/965,365

(22) Filed: Dec. 27, 2007

(65) Prior Publication Data

US 2009/0140426 A1 Jun. 4, 2009

(30) Foreign Application Priority Data

Nov. 30, 2007 (KR) .................... 10-2007-0123771

(51) Int. Cl.
*H01L 23/48* (2006.01)
(52) U.S. Cl. .................. 257/741; 257/780; 257/781; 257/778; 257/783; 257/738; 257/E21.503; 257/E21.002; 438/106; 438/108; 438/118; 438/127; 438/613; 228/180.22
(58) Field of Classification Search ............. 257/690, 257/697, 780, 781, 778, 783, 737, 738, 777, 257/779, E21.503, E21.002, E23.116, E23.117, 257/E23.119, E23.002; 438/106, 108, 118, 438/127, 597, 612, 613; 228/180.21
See application file for complete search history.

(56) References Cited

U.S. PATENT DOCUMENTS

| 4,268,614 | A | * | 5/1981 | Ueyama et al. | ............. 430/315 |
| 4,396,936 | A | * | 8/1983 | McIver et al. | ............... 174/252 |
| 5,906,042 | A | * | 5/1999 | Lan et al. | ....................... 29/852 |
| 5,920,462 | A | * | 7/1999 | Glovatsky et al. | ........... 361/760 |
| 2002/0033525 | A1 | * | 3/2002 | Ohuchi | ........................ 257/679 |
| 2002/0056906 | A1 | * | 5/2002 | Kajiwara et al. | ............. 257/697 |

(Continued)

FOREIGN PATENT DOCUMENTS

JP 2000-323612 A 11/2000

(Continued)

*Primary Examiner*—A. Sefer
*Assistant Examiner*—Ermias Woldegeorgis
(74) *Attorney, Agent, or Firm*—Ladas & Parry LLP

(57) ABSTRACT

A flip chip package includes a substrate and a semiconductor chip. The substrate includes a substrate body, a metal wiring having a terminal part some of which is disposed in the substrate body, a solder resist pattern formed on the substrate body with an opening for exposing the terminal part, and an organic anti-oxidation layer for covering the terminal part. The semiconductor chip has a bump formed through (e.g., penetrates) the organic anti-oxidation layer and is electrically connected to the terminal part. The present invention prevents oxidation of the terminal part and allows easy coupling of a bump of a semiconductor chip and the terminal part of the substrate, since an anti-oxidation layer including an organic matter is formed over a surface of a terminal part including copper which is easily oxidized.

19 Claims, 6 Drawing Sheets

U.S. PATENT DOCUMENTS

| | | | |
|---|---|---|---|
| 2003/0098440 A1* | 5/2003 | Musa et al. | 252/182.13 |
| 2003/0193094 A1* | 10/2003 | Takahashi et al. | 257/780 |
| 2005/0070084 A1* | 3/2005 | Hsu et al. | 438/612 |

FOREIGN PATENT DOCUMENTS

| | | |
|---|---|---|
| KR | 1020010063236 | 7/2001 |
| KR | 1020010093652 | 10/2001 |
| KR | 1020020036669 A | 5/2002 |
| KR | 1020050118706 A | 12/2005 |
| KR | 10-0685177 B1 | 2/2007 |
| KR | 1020050113970 | 4/2007 |

* cited by examiner

FLIP CHIP PACKAGE AND METHOD FOR MANUFACTURING THE SAME

CROSS-REFERENCE TO RELATED APPLICATIONS

The present application claims priority to Korean patent application number 10-2007-0123771 filed on Nov. 30, 2007, which is incorporated herein by reference in its entirety.

BACKGROUND OF THE INVENTION

The present invention relates generally to a flip chip package and a method for manufacturing the same.

Recent developments in semiconductor manufacturing technology have lead to various types of semiconductor packages having a semiconductor device that is suitable for processes massive amounts of data in a short period of time.

When a semiconductor package is manufactured it goes through a semiconductor chip manufacturing process for manufacturing the semiconductor chip (which includes a semiconductor device on a wafer made of high purity silicon), a die sorting process for inspecting the semiconductor chip and determining whether the semiconductor chip is good, and a packaging process for packaging the good semiconductor chips.

Recently, a chip scale package such as a flip chip package, having a volume that is no more than 100% to 105% of the volume of a semiconductor chip has been developed.

In the flip chip package, a bump is formed in a bonding pad of a semiconductor chip, and then the bump of the semiconductor chip is connected to a terminal part of a substrate, thereby significantly decreasing the volume of a semiconductor package.

However, the conventional flip chip package has a problem in that the electric characteristics of the bump and the terminal part are significantly reduced by oxidation of the terminal part of the substrate.

SUMMARY OF THE INVENTION

Embodiments of the present invention are directed to a flip chip package that can prevent oxidation in the terminal part of a substrate and electrically connect the terminal part and a bump of a semiconductor chip without an additional process.

Further, embodiments of the present invention are directed to a method for manufacturing the flip chip package.

In one embodiment, a flip chip package comprises a substrate including a substrate body, a metal wiring having a terminal part disposed in the substrate body, a solder resist pattern formed over the substrate with an opening exposing the terminal part, and an organic anti-oxidation layer covering the terminal part; and a semiconductor chip having a bump formed through the organic anti-oxidation layer, the bump being electrically connected to the terminal part.

The terminal part includes copper.

The organic anti-oxidation layer may be selectively disposed over the terminal part.

The organic anti-oxidation layer may also be disposed over the entire area of the solder resist pattern and disposed over the entire area of the terminal part.

A thickness of the organic anti-oxidation layer is in the range of 0.1 µm to 100 µm.

The organic anti-oxidation layer includes one of an epoxy resin, a polypropylene resin, and a polyethylene resin.

The organic anti-oxidation layer includes a thermoplastic resin.

The flip chip package may further comprise an adhesive member formed between the semiconductor chip and the substrate.

The bump includes gold or copper.

In another embodiment, a method for manufacturing a flip chip package comprises the steps of preparing a substrate including a substrate body, a terminal part disposed over the substrate body, and a solder resist pattern formed over the substrate body with an opening for exposing the terminal part; forming an organic anti-oxidation layer covering the terminal part; and electrically connecting a bump of a semiconductor chip to the terminal part through the organic anti-oxidation layer.

In the step of preparing the substrate, the terminal part comprises copper.

In the step of forming the organic anti-oxidation layer, the organic anti-oxidation layer includes one of an epoxy resin, a polypropylene resin, and a polyethylene resin.

The step of forming the organic anti-oxidation layer may include the steps of disposing a pattern mask over the solder resist pattern with an opening corresponding to the terminal part; providing anti-oxidation material to the pattern mask; and removing the pattern mask from the solder resist pattern.

The step of forming the organic anti-oxidation layer may include the steps of rotating the substrate; and providing flowable anti-oxidation material onto the solder resist pattern of the rotated substrate.

The step of forming the organic anti-oxidation layer may include the step of spraying anti-oxidation material onto the solder resist pattern.

The step of forming the organic anti-oxidation layer may include the step of dipping the substrate into a vessel containing anti-oxidation material.

The organic anti-oxidation layer is formed to a thickness in the range of 0.1 µm to 100 µm.

The step of electrically connecting the bump and the terminal part includes the step of applying at least one of heat and ultrasonic wave to either of the semiconductor chip and the substrate.

In the step of electrically connecting the bump and the terminal part, the semiconductor chip is heated to 50° C. through 300° C., the substrate is heated to 20° C. through 200° C. and a pressure of 1 Pa through 500 Pa is applied to the terminal part and the bump such that the bump penetrates through the organic anti-oxidation layer.

The method may further comprise, after electrically connecting the bump and the terminal part, the step of forming an adhesive member between the semiconductor chip and the substrate for attaching the semiconductor chip and the substrate.

DESCRIPTION OF SPECIFIC EMBODIMENTS

Figure 1:
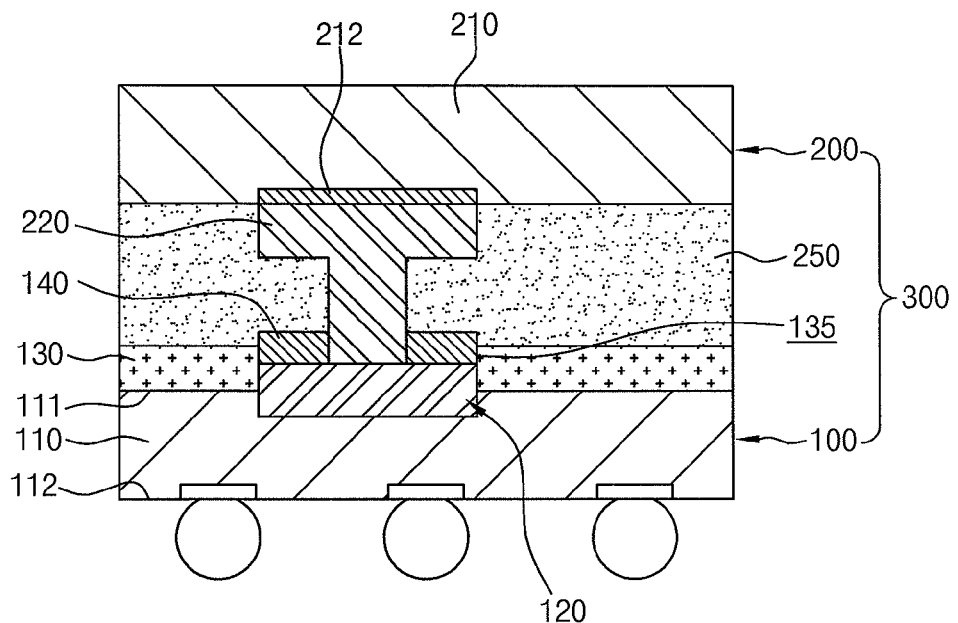
FIG. 1 is a cross-sectional view showing a flip chip package in accordance with an embodiment of the present invention.

FIG. 1 is a cross-sectional view illustrating a flip chip package in accordance with an embodiment of the present invention.

A flip chip package 300 includes a substrate 100 and a semiconductor chip 200.

The semiconductor chip 100 includes a substrate body 110, a terminal part 120 of a metal wiring, a solder resist pattern 130, and an organic anti-oxidation layer 140.

The substrate body 110 is, for example, a plate shaped printed circuit board (PCB). The substrate body 110 includes a first surface 111 and a second surface 112 opposite to the first surface 111.

The terminal part 120 of the metal wiring is disposed, for example, over the first surface 111 of the substrate body 110. In the present embodiment, the terminal part 120 of the metal wiring may include, for example, copper having superior electrical characteristics.

The solder resist pattern 130 is disposed over the first surface 111 of the substrate body 110. The solder resist pattern 130 has an opening 135 for exposing the terminal part 120 of the metal wiring.

The organic anti-oxidation layer 140 covers the terminal part 120 of the metal wiring and prevents the formation of an oxide layer over the surface of the terminal part 120 (which includes the copper).

As shown in FIG. 1, in the present embodiment, the organic anti-oxidation layer 140 may be selectively disposed, so that it is disposed only over the terminal part 120 and not over the surface of the solder resist pattern 130.

Figure 2:
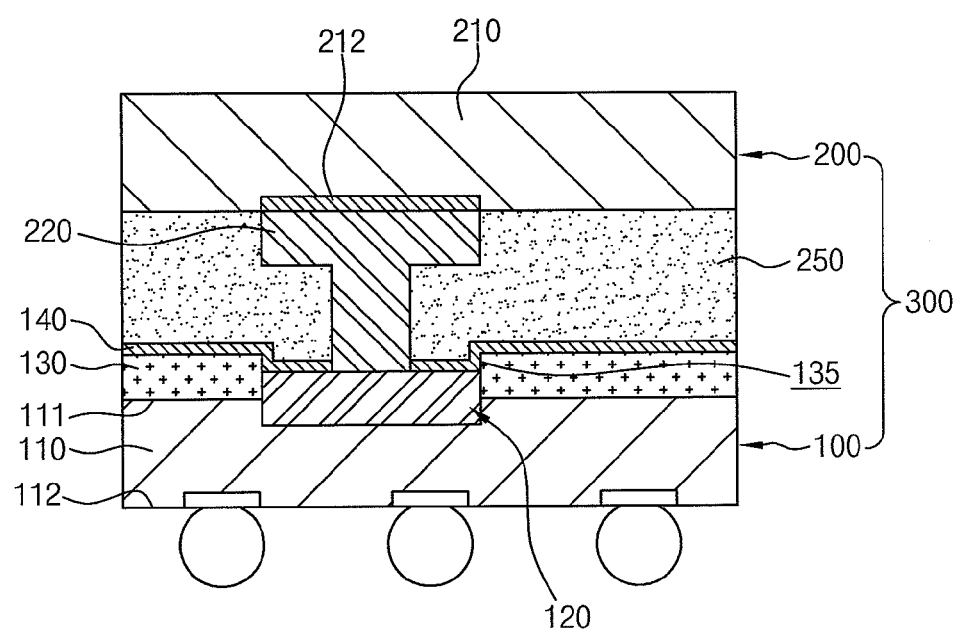
FIG. 2 is a cross-sectional view showing a flip chip package in accordance with another embodiment of the present invention.

Although in the present embodiment shown in FIG. 1, the organic anti-oxidation layer 140 is selectively disposed over the terminal part 120, the organic anti-oxidation layer 140 may alternatively cover the solder resist pattern 130 and the terminal part 120 as shown in FIG. 2.

Referring again to FIG. 1, the thickness of the organic anti-oxidation layer 140 when measured from the surface of the terminal part 120 may be about 0.1 μm to about 100 μm. When the thickness of the organic anti-oxidation layer 140 is shallower than about 0.1 μm, the organic anti-oxidation layer 140 is partially unformed over the terminal part 120, and a portion of the uncovered terminal part may be oxidized. Conversely, when the thickness of the organic anti-oxidation layer 140 is thicker than about 100 μm, the thick organic anti-oxidation layer 140 may keep the bump of the semiconductor chip (which will be described later) and the terminal part 120 from being electrically connected.

Examples of materials that may be used as the organic anti-oxidation layer 140 disposed over the terminal part 120 include a high molecular synthetic resin such as an epoxy resin, a polypropylene resin, a polyethylene resin, and the like. The organic anti-oxidation layer 140 including the high molecular synthetic resin may serve as a protective layer for preventing damage and/or scratching to the substrate 100 caused by external force.

Alternatively, the organic anti-oxidation layer 140 disposed over the terminal part 120 may include a thermoplastic resin.

The semiconductor chip 200 includes a semiconductor chip body 210 and the bump 220.

The semiconductor chip body 210 is disposed over an upper portion of the first surface 111 of the substrate 110, and the semiconductor chip body 210 includes a circuit part (not shown) and a bonding pad 212.

The circuit part includes a data storage part for storing data and a data processing part for processing the data, and the bonding pad 212 is electrically connected to the circuit part.

The bump 220 is disposed over the bonding pad 212 and includes a protrusion. The bump 220 may include solder, gold, or copper. In the present embodiment, the bump 220 includes gold.

The bump 220 of the semiconductor chip 200 penetrates the organic anti-oxidation layer 140 formed over the terminal part of the substrate 100; and as such, the bump 220 and the terminal part 120 are electrically connected to each other.

In the present invention, when the bump 220 and the terminal part 120 are electrically connected to each other, the organic anti-oxidation layer 140 remains over the terminal part 120, and the remaining organic anti-oxidation layer 140 prevents oxidation of the terminal part 120.

Meanwhile, an adhesive member 250 may be disposed between the substrate 100 and the semiconductor chip 200. The adhesive member 250 attaches the semiconductor chip 200 to the substrate 100. Also, in the present embodiment, the adhesive member 250 serves to prevent the formation of a vacant space between the semiconductor chip 200 and the substrate 100. The adhesive member 250 may be a non-conductive film including adhesive material.

As previously described, the terminal part 120, which includes copper) can easily become oxidized. According to the present embodiment, the organic anti-oxidation layer 140 (including an organic matter) is formed over the terminal part 120, and the organic anti-oxidation layer 140 prevents oxidation of the terminal part 120. As such, it is unnecessary to form a nickel layer and/or a gold layer for preventing oxidation of the terminal part 120 over the terminal part 120. Thus, the present invention provides a simplified flip chip package structure, in which the number of processes required for manufacturing the flip chip package is decreased and the cost associated with manufacturing the flip chip package is significantly decreased.

FIGS. 3 through 11 are cross-sectional views shown for illustrating the steps of a method for manufacturing a flip chip package in accordance with an embodiment of the present invention.

Figure 3:
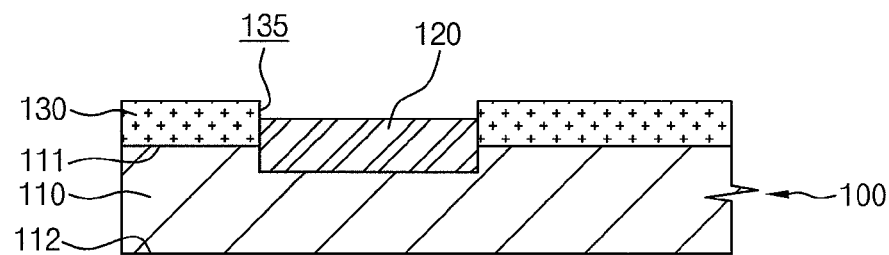
FIG. 3 is a cross-sectional view showing a substrate of the flip chip package.

FIG. 3 is a cross-sectional view showing the substrate of a flip chip package.

Referring to FIG. 3, a substrate 100 is prepared for manufacturing a flip chip package.

The semiconductor chip 100 includes a substrate body 110 having a rectangular parallelepiped shape. The substrate body 110 may be a printed circuit board (PCB) having a first surface 111 and a second surface 112 opposite to the first surface 111.

A terminal part 120 is formed over the first surface 111 of the substrate body 110. An example of a material that may be used as the terminal part 120 includes copper having superior electric characteristics.

After the terminal part 120 is formed over the first surface 111 of the substrate body 110, a solder resist pattern 130 having an opening 135 for exposing the terminal part 120 is formed over the first surface 111.

Figure 4:
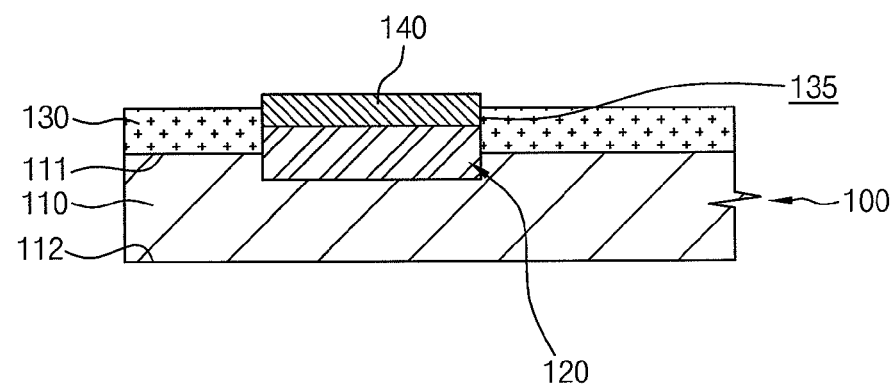
FIG. 4 is a cross-sectional view showing an organic anti-oxidation layer disposed at a terminal part of the substrate shown in FIG. 3.

FIG. 4 is a cross-sectional view showing an organic anti-oxidation layer disposed at the terminal part of the substrate shown in FIG. 3.

Referring to FIG. 4, after the solder resist pattern 130 is formed, an organic anti-oxidation layer 140 is formed over the terminal part 120 in order to prevent oxidation of the terminal part 120 exposed by the opening 135 of the solder resist pattern 130.

Figure 5:
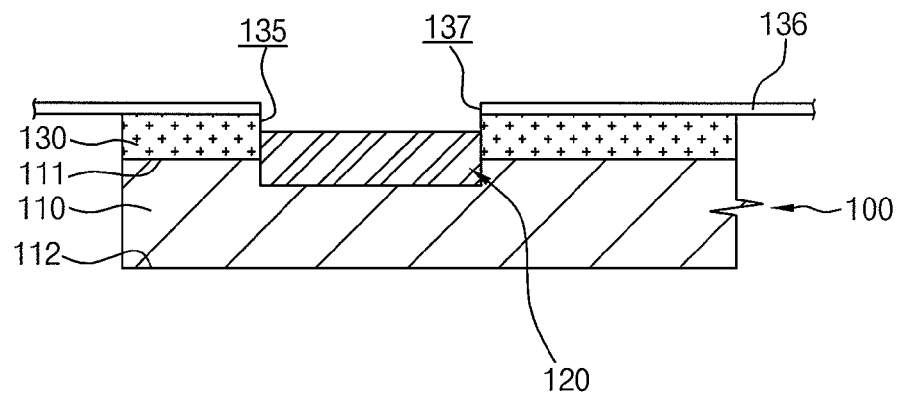
FIGS. 5 and 6 are cross-sectional views shown for illustrating the steps of forming the terminal part shown in FIG. 4.
Figure 6:
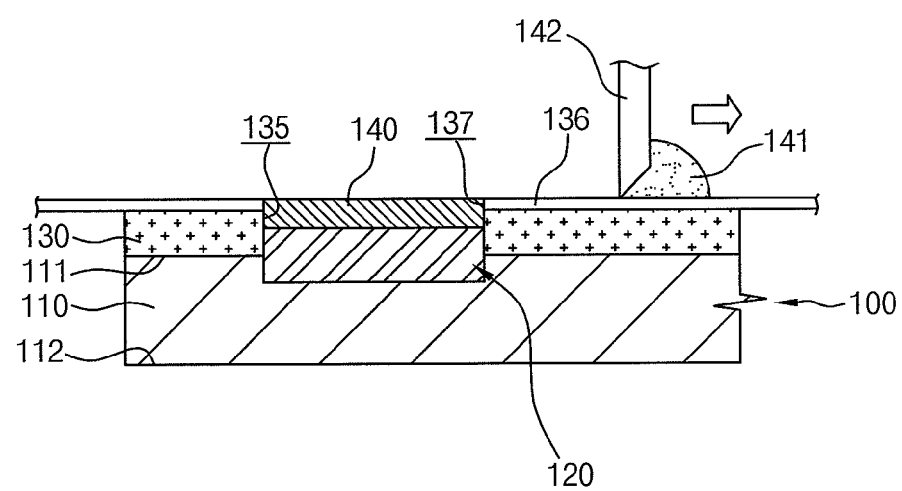

FIGS. 5 and 6 are cross-sectional views shown for illustrating the steps of forming the terminal part shown in FIG. 4.

Referring to FIG. 5, a pattern mask 136 is disposed over the solder resist pattern 130. The pattern mask 136 has an opening 137 corresponding to the opening 135 of the solder resist pattern 130.

After the pattern mask 136 is disposed over the solder resist pattern 130, a flowable organic anti-oxidation material 141 is provided on the pattern mask 136. In the present embodiment, the organic anti-oxidation material may be, for example, a high molecular synthetic resin such as an epoxy resin, a polypropylene resin, a polyethylene resin, and the like.

The flowable organic anti-oxidation material 141 is selectively formed over the terminal part 120 in the opening 137 of the pattern mask 136 using a scraper 142 to form an organic anti-oxidation layer 140 over the terminal part 120.

A thickness of the organic anti-oxidation layer 140 formed selectively over the terminal part 120 may be about 0.1 μm to about 100 μm. When the thickness of the organic anti-oxidation layer 140 is shallower than about 0.1 μm, an unformed portion of the organic anti-oxidation layer 140 may be generated over the terminal part 120, and consequently an oxide layer may be formed on the uncovered portion of the terminal part 120. Conversely, when the organic anti-oxidation layer 140 is thicker than about 100 μm, the thickness of the organic anti-oxidation layer 140 may keep the bump of the semiconductor chip (which will be further described later) and the terminal part 120 from being electrically connected.

In the present embodiment, the organic anti-oxidation layer 140 is formed over the terminal part 120 using the pattern mask 136 as shown in FIGS. 5 and 6. However, it the organic anti-oxidation material 136 can be directly provided on the solder resist pattern 130 without the pattern mask 136, and then the organic anti-oxidation layer 140 is formed over the terminal part 120 using the scraper 142.

Figure 7:
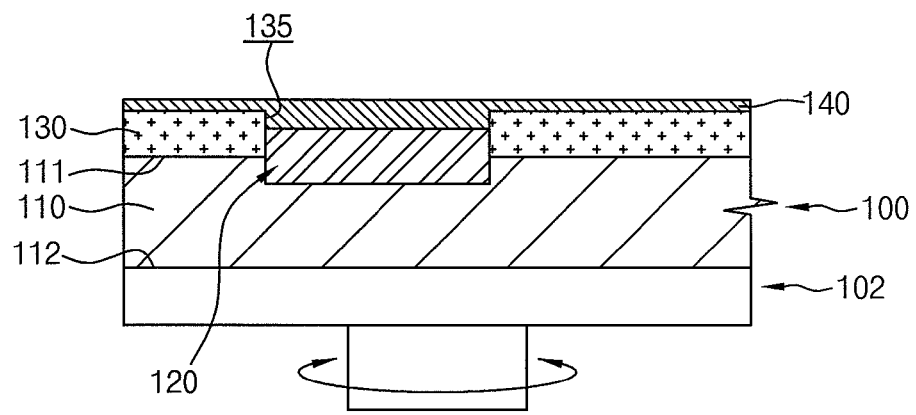
FIG. 7 is a cross-sectional view shown for illustrating the process of forming an organic anti-oxidation layer over a solder resist pattern in accordance with another embodiment of the present invention.

FIG. 7 is a cross-sectional view shown for illustrating the process of forming an organic anti-oxidation layer over a solder resist pattern in accordance with another embodiment of the present invention.

Referring to FIG. 7, in order to form an organic anti-oxidation layer over the terminal part 120, flowable organic anti-oxidation material is provided on the solder resist pattern 130 having the opening 135 exposing the terminal part 120. The substrate 100 is rotated at a high speed using a substrate rotating apparatus 102 to form the organic anti-oxidation layer 140 over the solder resist pattern 130.

In the present embodiment, the thickness of the organic anti-oxidation layer 140 may be, for example, about 0.1 μm to about 100 μm. In the present embodiment, the flowable organic anti-oxidation material may be, for example, a high molecular synthetic resin such as an epoxy resin, a polypropylene resin, a polyethylene resin, and the like.

The organic anti-oxidation layer 140 formed by providing the flowable organic anti-oxidation material onto the solder resist pattern 130 and rotating the substrate 100 at a high speed has the advantage of particularly high flatness.

Figure 8:
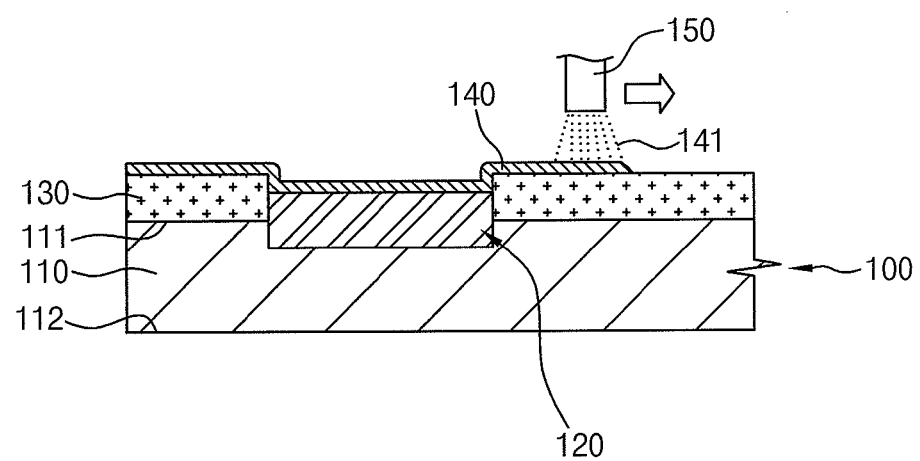
FIG. 8 is a cross-sectional view shown for illustrating the process of forming an organic anti-oxidation layer over a solder resist pattern in accordance with further another embodiment of the present invention.

FIG. 8 is a cross-sectional view shown for illustrating the process of forming an organic anti-oxidation layer over a solder resist pattern in accordance with another embodiment of the present invention.

Referring to FIG. 8, in order to form an organic anti-oxidation layer over the terminal part 120, a dispenser 150 is used to provide flowable organic anti-oxidation material 141 on the solder resist pattern 130 having the opening 135 exposing the terminal part 120, thereby forming the organic anti-oxidation layer 140 over the solder resist pattern 130.

In the present embodiment, the thickness of the organic anti-oxidation layer 140 formed of the organic anti-oxidation material 141 provided via the dispenser 150 may be, for example, about 0.1 μm to about 100 μm.

In the present embodiment, the flowable organic anti-oxidation material, which is sprayed on the solder resist pattern 130 using the dispenser 150, may be, for example, a high molecular synthetic resin such as an epoxy resin, a polypropylene resin, a polyethylene resin, and the like.

Forming the organic anti-oxidation layer 140 by spraying the organic anti-oxidation material 141 onto the solder resist pattern 130 using the dispenser 150 has the advantage of high thickness uniformity.

Figure 9:
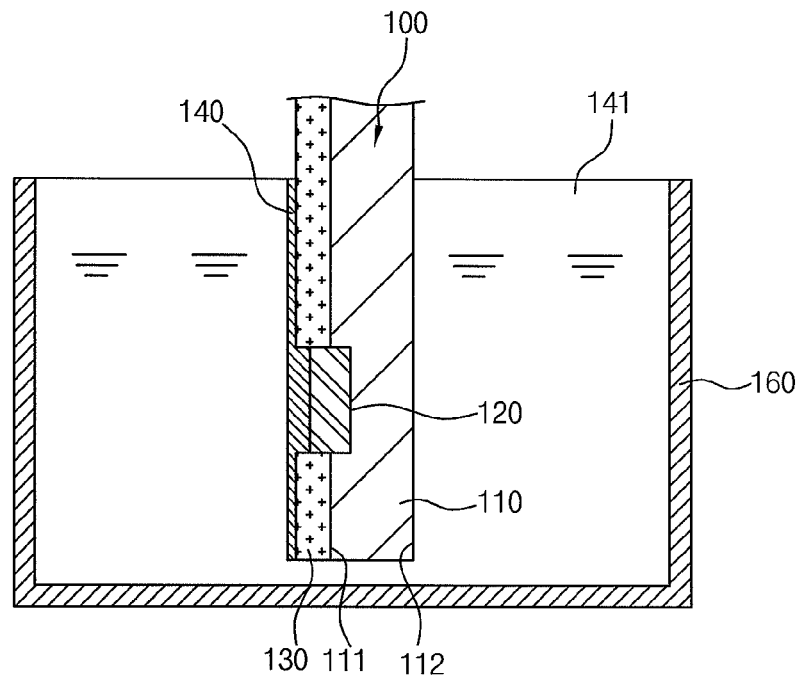
FIG. 9 is a cross-sectional view shown for illustrating the process of forming an organic anti-oxidation layer over a solder resist pattern in accordance with yet another embodiment of the present invention.

FIG. 9 is a cross-sectional view shown for illustrating the process of forming an organic anti-oxidation layer over a solder resist pattern in accordance with yet another embodiment of the present invention.

Referring to FIG. 9, a substrate 100 having a solder resist pattern 130 and an exposed terminal part 120 is dipped into a receiving vessel 160 containing a flowable anti-oxidation layer 141, thereby forming the organic anti-oxidation layer 140 over the solder resist pattern 130.

Figure 10:
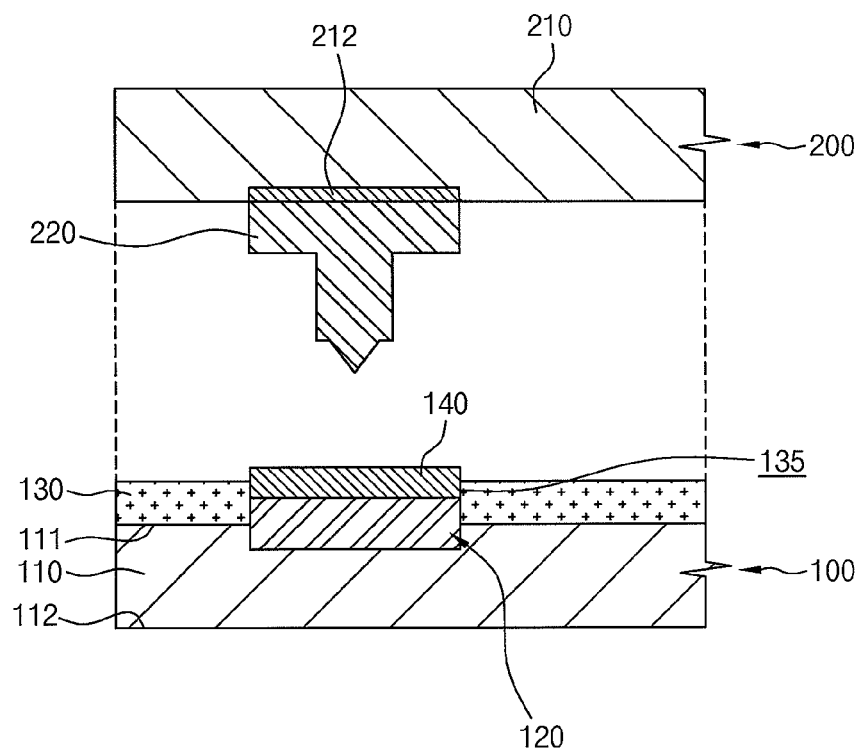
FIG. 10 is a cross-sectional view in which a bump of a semiconductor chip is aligned over the substrate having the organic anti-oxidation layer in accordance with an embodiment of the present invention.

FIG. 10 is a cross-sectional view in which the bump of a semiconductor chip is aligned over the substrate having the organic anti-oxidation layer in accordance with an embodiment of the present invention.

Referring to FIG. 10, after the organic anti-oxidation layer 140 for covering the terminal part 120 exposed by the opening of the solder resist pattern 130 is formed using one of the methods illustrated in FIGS. 5 through 9, the terminal part 120 of the substrate 100 and the bump 220 disposed over the bonding pad 212 of the semiconductor chip 200 are aligned.

Figure 11:
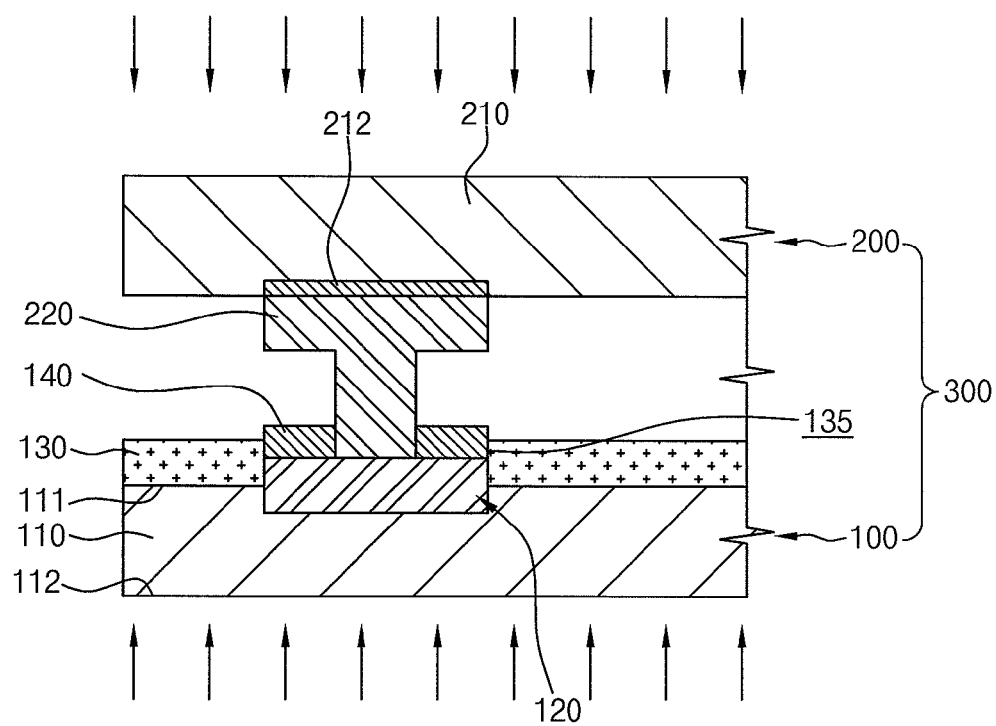
FIG. 11 is a cross-sectional view in which the bump of the semiconductor chip and the terminal part of the substrate shown in FIG. 10 are electrically connected.

FIG. 11 is a cross-sectional view in which the bump of the semiconductor chip and the terminal part of the substrate shown in FIG. 10 are electrically connected.

Referring to FIG. 11, after the bump 220 of the semiconductor chip 200 and the terminal part 120 of the substrate 100 are aligned, the bump 220 of the semiconductor chip 200 and the terminal part 120 of the substrate 100 are coupled to each other.

In order to couple the bump 220 of the semiconductor chip 200 and the terminal part 120 of the substrate 100, heat and/or an ultrasonic wave is provided to the semiconductor chip 200 and the substrate 100.

More specifically, the semiconductor chip 200 is heated to, for example, in the range of about 50° C. to about 300° C. and the substrate 100 is heated to, for example, in the range of about 20° C. through about 200° C. At the same time, a pressure in the range of about 1 Pa to about 500 Pa is applied to the terminal part 120 of the substrate 100 and the bump 220 of the semiconductor chip 200. The bump 220 of the semiconductor chip 200 penetrates the organic anti-oxidation layer 140 and is electrically connected to the terminal part 120 of the substrate 100.

After the bump 220 of the semiconductor chip 200 and the terminal part 120 of the substrate 100 are electrically connected, a flowable adhesive material is provided in the gap between the semiconductor chip 200 and the substrate 100. The flowable adhesive material is hardened to form the adhesive member 250 between the semiconductor chip 200 and the substrate 100 shown in FIGS. 1 and 2.

As is apparent from the above description, by forming an anti-oxidation layer including an organic matter over a surface of the terminal part that includes copper (which is easily oxidized), the present invention makes it possible to prevent oxidation of the terminal part and possible to easily couple a bump of a semiconductor chip with the terminal part.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A flip chip package, comprising:
    a substrate comprising:
        a substrate body;
        a metal wiring having a terminal part disposed in the substrate body, the terminal part comprising copper;
        a solder resist pattern formed over the substrate body with an opening exposing the terminal part; and
        an organic anti-oxidation layer formed to be physically separated from the substrate body so as to not directly contact the substrate body, the organic anti-oxidation layer covering the terminal part including the upper surface of the terminal part, and the organic anti-oxidation layer acting to prevent oxidation of the terminal part; and
    a semiconductor chip comprising:
        a bump comprising one of gold and copper formed to contact the copper of the terminal part through the organic anti-oxidation layer, the bump being electrically connected to the terminal part; and
    an adhesive member disposed between the substrate and the semiconductor chip to cover the organic anti-oxidation layer, such that the organic anti-oxidation layer is between the substrate and the adhesive member.

2. The flip chip package according to claim 1, wherein a thickness of the organic anti-oxidation layer is in the range of 0.1 μm to 100 μm.

3. The flip chip package according to claim 1, wherein the organic anti-oxidation layer includes one of an epoxy resin, a polypropylene resin, and a polyethylene resin.

4. The flip chip package according to claim 1, wherein the organic anti-oxidation layer includes a thermoplastic resin.

5. The flip chip package according to claim 1, wherein an end portion of the bump abutting the terminal part has a first area and a surface of the terminal part abutting the end portion of the bump has a second area that is larger than the first area.

6. A flip chip package, comprising:
    a substrate comprising:
        a substrate body;
        a metal wiring having a terminal part disposed over the substrate body, wherein the terminal part comprises copper;
        a solder resist pattern formed over the substrate body with an opening exposing the terminal part; and
        an organic anti-oxidation layer formed to be physically separated from the substrate body so as to not directly contact the substrate body, the organic anti-oxidation layer covering the terminal part including an upper surface of the terminal part facing away from the substrate body, and the organic anti-oxidation layer acting to prevent oxidation of the copper terminal part; and
    a semiconductor chip comprising:
        a bump comprising one of gold and copper contacting the copper of the terminal part through the organic anti-oxidation layer, the bump being electrically connected to the terminal part,
    wherein the organic anti-oxidation layer is disposed over the entire area of the solder resist pattern and disposed over the entire area of the terminal part and the solder resist pattern has a first thickness and the organic anti-oxidation layer has a second thickness of no more than the first thickness.

7. The flip chip package according to claim 6, wherein the organic anti-oxidation layer is selectively formed so as to cover the terminal part but not the solder resist pattern, such that an adhesive member attaching the semiconductor chip to the substrate is formed on the solder resist pattern.

8. The flip chip package according to claim 6, wherein the organic anti-oxidation layer comprises any one of a polypropylene resin and a polyethylene resin.

9. A method for manufacturing a flip chip package, comprising the steps of:
    providing a substrate comprising a substrate body, a terminal part disposed over the substrate body and comprising copper, and a solder resist pattern formed over the substrate body with an opening for exposing the terminal part;
    providing a semiconductor chip having a bump comprising one of gold and copper formed thereon,
    forming an organic anti-oxidation layer to be physically separated from the substrate body so as to not directly contact the substrate body, the organic anti-oxidation layer covering the terminal part including an upper surface of the terminal part, and the organic anti-oxidation layer being formed so as to act to prevent oxidation of the terminal part; and
    electrically connecting the bump of the semiconductor chip and the terminal part such that the bump contacts the copper of the terminal part through the organic anti-oxidation layer; and+
    forming an adhesive member in the gap between the substrate and the semiconductor chip.

10. The method according to claim 9, wherein the terminal part comprises copper.

11. The method according to claim 9, wherein in the step of forming the organic anti-oxidation layer, the organic anti-oxidation layer includes one of an epoxy resin, a polypropylene resin, and a polyethylene resin.

12. The method according to claim 9, wherein the step of forming the organic anti-oxidation layer comprises the steps of:
    disposing a pattern mask over the solder resist pattern with an opening corresponding to the terminal part;
    providing anti-oxidation material to the pattern mask; and
    removing the pattern mask from the solder resist pattern.

13. The method according to claim 9, wherein the step of forming the organic anti-oxidation layer comprises the steps of:

providing flowable anti-oxidation material onto the solder resist pattern; and rotating the substrate having the flowable anti-oxidation material.

14. The method according to claim 9, wherein the step of forming the organic anti-oxidation layer comprises the step of spraying anti-oxidation material onto the solder resist pattern.

15. The method according to claim 9, wherein the step of forming the organic anti-oxidation layer comprises the step of dipping the substrate into a vessel containing anti-oxidation material.

16. The method according to claim 9, wherein the organic anti-oxidation layer is formed to a thickness in the range of 0.1 μm to 100 μm.

17. The method according to claim 9, wherein the step of electrically connecting the bump and the terminal part comprises the step of applying at least one of heat and ultrasonic wave to either of the semiconductor chip and the substrate.

18. The method according to claim 9, wherein in the step of electrically connecting the bump and the terminal part, the semiconductor chip is heated to 50° C. to 300° C., the substrate is heated to 20° C. to 200° C. and a pressure of 1 Pa to 500 Pa is applied to the terminal part and the bump such that the bump penetrates through the organic anti-oxidation layer.

19. The method according to claim 9, further comprising, after electrically connecting the bump and the terminal part, the step of forming an adhesive member between the semiconductor chip and the substrate for attaching the semiconductor chip and the substrate.

* * * * *